United States Patent [19]

Tseng

[11] 4,166,258

[45] Aug. 28, 1979

[54] THIN-FILM INTEGRATED CIRCUIT WITH TANK CIRCUIT CHARACTERISTICS AND APPLICATIONS TO THIN-FILM FILTERS AND OSCILLATORS

[75] Inventor: Samuel C.-C. Tseng, Yorktown Heights, N.Y.

[73] Assignee: International Business Machines Corporation, Armonk, N.Y.

[21] Appl. No.: 501,552

[22] Filed: Aug. 29, 1974

[51] Int. Cl.² .................. H03H 9/04; H03H 9/20; H03H 9/26; H01L 41/10

[52] U.S. Cl. .................................. 333/195; 310/313; 331/107 A; 333/196

[58] Field of Search .................. 33/72, 30 R; 310/8, 310/8.1, 9.8, 313, 365, 366; 331/107 A

[56] References Cited

U.S. PATENT DOCUMENTS

| | | | |
|---|---|---|---|
| 3,510,674 | 5/1970 | Biard | 333/70 R |
| 3,550,045 | 12/1970 | Adler | 333/30 X |
| 3,568,102 | 3/1971 | Tseng | 333/72 X |
| 3,675,054 | 7/1972 | Jones et al. | 310/9.8 |
| 3,716,809 | 2/1973 | Reeder et al. | 333/30 R X |
| 3,760,204 | 9/1973 | Yester, Jr. | 333/72 X |
| 3,781,717 | 12/1973 | Kuenemund | 333/72 X |
| 3,801,935 | 4/1974 | Mitchell | 333/72 |
| 3,855,548 | 12/1974 | Nandi et al. | 333/30 R X |

OTHER PUBLICATIONS

"Ultrasonics", Jan. 1971; pp. 43–45.
Bristol–"Analysis and Design of Surface Acoustic Wave Transducers"–Conference International Specialist Seminar on Component Performance and Systems Applications of Surface Acoustic Wave Devices; Avlemore, Scotland, (Sep. 25–28 1973); pp. 115–129.

*Primary Examiner*—Alfred E. Smith
*Assistant Examiner*—Marvin Nussbaum
*Attorney, Agent, or Firm*—Pollock, Vande Sande & Priddy

[57] ABSTRACT

A thin-film integrated circuit with tank circuit characteristics may comprise a surface acoustic wave transducer with appropriate geometry. A preferred embodiment of such integrated circuit includes, in addition to the surface acoustic wave transducer, surface acoustic wave reflecting means located adjacent the transducer, and preferably on opposite sides thereof. The reflecting means may include a pair of reflectors and be proportioned so that the device exhibits a single resonant-antiresonant frequency pair, such as a single tank circuit. Alternatively, the reflectors may be proportioned such that the device exhibits multiple resonant-anti-resonant frequency pairs. The operating frequency may be as high as hundreds of megahertz to one gigahertz.

Applications of the thin-film integrated circuit to thin-film filters and oscillators are also disclosed.

In addition a novel form of surface acoustic wave transducer is disclosed which exhibits lower equivalent capacitance than do prior art surface acoustic wave transducers.

9 Claims, 16 Drawing Figures

FIG. 1 PRIOR ART
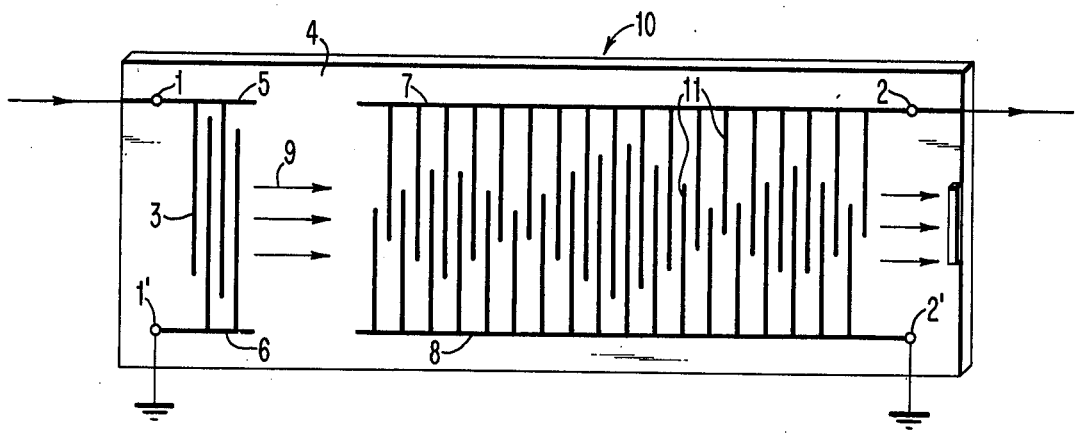
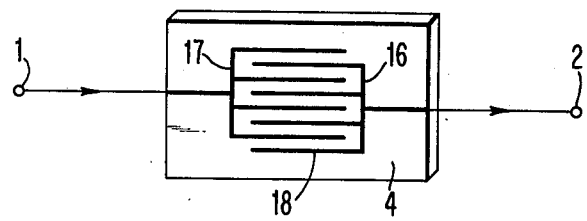
FIG. 2A
FIG. 2B
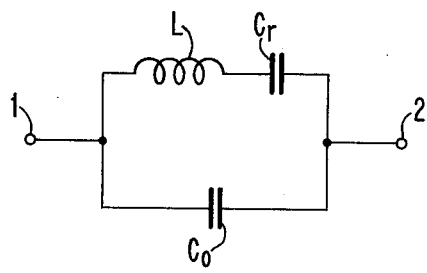
FIG. 2C
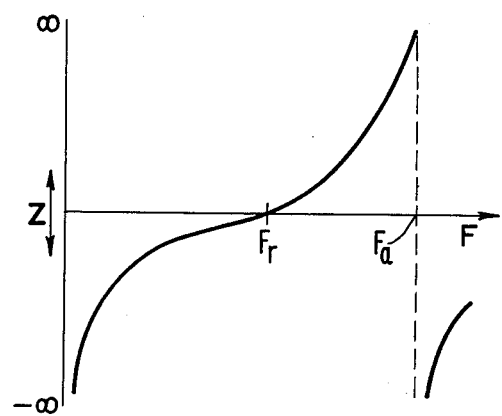

THIN-FILM INTEGRATED CIRCUIT WITH TANK CIRCUIT CHARACTERISTICS AND APPLICATIONS TO THIN-FILM FILTERS AND OSCILLATORS

BACKGROUND OF THE INVENTION

Surface acoustic wave devices are known to the prior art. In one form these devices comprise a pattern of conductors on a piezoelectric substrate. Usually the pattern of conductors comprises a pair of parallel opposed, spaced conductors each of which has a number of so-called interdigital electrodes orthogonal to and connected to the conductor. The interdigital electrodes have a length which is less than the spacing between the conductors and are all parallel to one another. Adjacent ones of the interdigital electrodes are connected to alternate ones of the conductors.

In this configuration an electric field produced by reason of a voltage difference between the conductors will generate a surface acoustic wave in the substrate due to its piezoelectric characteristic. The prior art has utilized these devices as filters in a two port four terminal device which includes a pair of transducers. The first transducer generates a surface acoustic wave by reason of a voltage applied to it via a pair of the terminals. The second transducer converts the surface acoustic wave generated by the first transducer to an electrical signal which is then coupled to the second pair terminals. By adjusting the materials of the transducers and the parameters thereof these devices can be made to have impedance characteristics which are frequency sensitive and thus can perform a filtering function.

Although these devices are useful they do have a number of drawbacks. For one thing, each requires a pair of surface acoustic wave transducing means to be deposited on the substrate. Furthermore, they require a certain amount of piezoelectric material to couple the surface acoustic waves generated by one transducer to the other transducer. Furthermore, there is a desire to sharpen the impedance characteristics of the device so that it could be used, for instance, as a tank circuit to form a basic building block for filter and oscillator applications.

Another frequency selective device which employs acoustic waves is the bulk-wave transducer. In this device, an electric field generated between two spaced electrodes is coupled through a piezoelectric material. In this application the frequency response of the device is very sharp. However, since the electric field is applied across the piezoelectric material the frequency response is directly dependent upon the thickness of the material between the electrodes. As a result accurate dimensions for the piezoelectric material are essential. Furthermore, as the desired frequency range of the device increases the thickness of the device must decrease. With present day technology the frequency range for bulk-wave piezoelectric devices is about 20 megahertz with an upper limit of 100 megahertz.

SUMMARY OF THE INVENTION

The present invention provides a two terminal thin-film integrated circuit exhibiting tank circuit characteristics. It includes a single surface acoustic wave transducing means which may have characteristics similar to those exhibited by the prior art. In that regard the transducer will have a pair of parallel conductors deposited on a piezoelectric substrate. Each of the conductors has connected thereto a plurality of orthogonal interdigital electrodes also deposited on the substrate. Adjacent ones of the interdigital electrodes are connected to different ones of the conductors. By increasing the number of interdigital electrodes the device will exhibit inductive reactance in a frequency range between a resonant and anti-resonant frequency.

In a preferred embodiment surface acoustic wave reflecting means are also provided on the substrate adjacent the surface acoustic wave (hereinafter SAW) transducer. The reflecting means enhance the inductive reactance of the device. The SAW reflecting means preferably includes a pair of SAW reflectors, each of which is located on opposite sides of the transducer. Furthermore, the reflectors may comprise a series of conductors, parallel to the interdigital electrodes. Alternatively, the reflectors may comprise a series of grooves, parallel to the interdigital electrodes. In a further embodiment, the reflectors may be provided by a series of parallel weighty dielectric bars placed atop the substrate. Regardless of the particular configuration of the reflectors the spacing between each of the different reflector elements would be equal. In order to construct a device with a single resonant-anti-resonant frequency pair, spacing of the reflector elements is made a quarter wavelength of the resonant frequency. By decreasing the spacing between the reflector elements (to about 60–80% of the quarter wavelength) frequency response becomes wide band and the entire device exhibits the characteristics of a multiple tank circuit, i.e., one with multiple resonant-anti-resonant frequency pairs.

The use of reflectors, is preferable for they increase the inductive reactance of the device without increasing the capacitive reactance. Another novel SAW transducer which exhibits a lower equivalent capacitance is also useful in devices exhibiting tank circuit characteristics. The novel SAW transducer may be used with or without the reflecting means referred to above, although preferably the reflecting means are used.

The novel SAW transducer has at least three parallel conductors, two of which are co-linear. Each of these conductors has connected thereto a number of interdigital electrodes orthogonal to the conductors. Of course, the co-linear conductors are spaced so as not to be electrically conductive. Adjacent ones of the interdigital electrodes are connected alternately to spaced conductors except in the region where a gap exists between two co-linear conductors. In this region, two adjacent interdigital electrodes are connected to the same conductor opposite the gap between the two co-linear conductors. By reducing the length over which any two conductors are parallel, the equivalent capacitance of the transducer is reduced without reducing the equivalent inductance. Of course, this can be extended to transducers with more than three parallel conductors by increasing the number of co-linear conductors with gaps therebetween.

A plurality of SAW devices each of which exhibits tank circuit characteristics can be deposited on a single piezoelectric substrate and electrically interconnected by deposited conductors to exhibit filter characteristics. Also, the device can be connected as a feedback element between input and output terminals of an amplifier to thereby comprise an oscillator. The frequency or frequencies of oscillation of the oscillator are then determined by the frequency response characteristics of the device.

BRIEF DESCRIPTION OF THE DRAWINGS

The apparatus of the present invention and the method of its manufacture will become clear from a reading of this description taken in conjunction with the attached drawings in which identical reference characters identify identical apparatus and in which:

FIG. 1 is a plan view of a prior art surface acoustic wave device;

FIG. 2A is a plan view of a surface acoustic wave device in accordance with the principles of this invention which exhibits tank circuit characteristics;

FIG. 2B is an equivalent circuit diagram of the electrical characteristics of the device shown in FIG. 2A;

FIG. 2C is a graphical illustration of the impedance versus frequency characteristics of the device illustrated in FIG. 2A;

DETAILED DESCRIPTION OF THE INVENTION

Figure 3A:
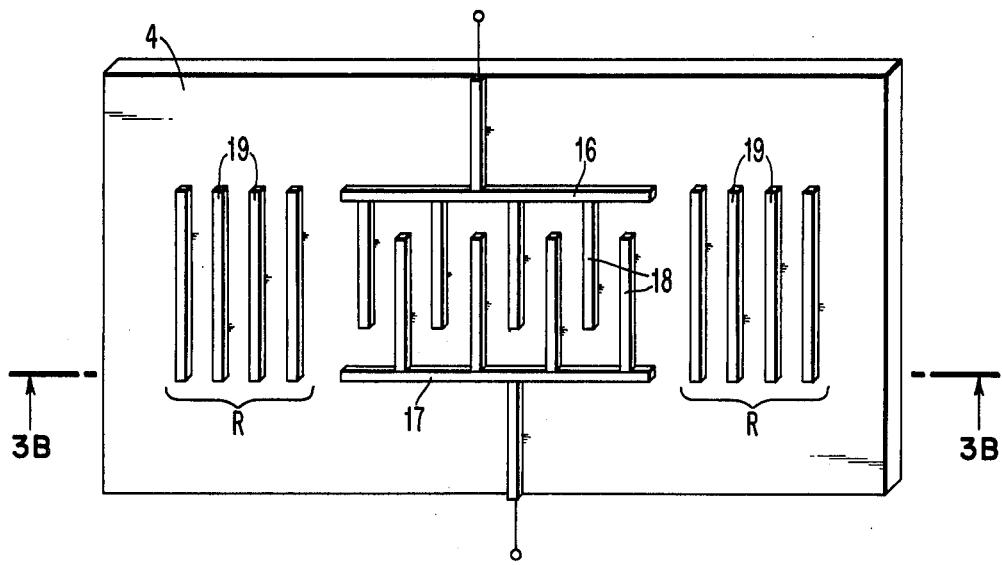
FIG. 3A is a plan view of a preferred embodiment of the present invention.

FIG. 1 illustrates a prior art two port, four terminal SAW device. This device 10 has input terminals 1–1' and output terminals 2–2'. On a piezoelectric substrate 4 a pair of parallel conductors 5 and 6 comprising a first SAW transducer are connected, respectively, to input terminals 1 and 1'. Connected to each of the conductors 5 and 6 are a plurality of interdigital electrodes 3 which may have been deposited on the substrate. As is illustrated in FIG. 1, adjacent ones of the interdigital electrodes 3 are connected to different conductors. When an electrical voltage is applied between terminals 1 and 1' an electric field is generated by the voltage and generates a surface acoustic wave by reason of the piezoelectric quality of the material 4. This surface acoustic wave is diagrammatically shown by the arrows 9.

A second SAW transducer is included in the device 10. This second transducer includes a second pair of parallel conductors 7 and 8 which are respectively connected to the output terminals 2 and 2'. A plurality of interdigital electrodes 11 are connected to the parallel conductors 7 and 8 with the interdigital electrodes 11 perpendicular to the conductors 7 and 8. Adjacent interdigital electrodes 11 are connected to different ones of the conductors 7 and 8. The surface acoustic wave generated by the first transducer is converted into an electrical potential by the piezoelectric material 4 which is coupled to interdigital electrodes 11. This potential is available at terminals 2 and 2'.

It should be understood, throughout the specification that the drawings appended hereto are not working drawings and the size and spacing of the interdigital electrodes are not drawn to scale. Furthermore, the number of interdigital electrodes and the length of the conductors to which they are attached should not be taken as a scale drawing. Information as to the spacing and width of interdigital electrodes as well as the number of them and the length of the conductors connected thereto will be given in this specification.

FIG. 2A is a schematic illustration of a surface acoustic wave device in accordance with the principles of my invention. A substrate 4, of piezoelectric material (such as lithium niobate), has a pair of parallel conductors 16 and 17 deposited thereon. These conductors are connected to external terminals in a manner which is conventional in the art. Also connected to conductors 16 and 17 are interdigital electrodes 18. As is illustrated in FIG. 2A adjacent interdigital electrodes 18 are connected to different ones of the conductors 16 and 17.

In order for the SAW device of my invention to exhibit the electrical characteristics of a tank circuit its electrical impedance must change from a capacitive reactance to an inductive reactance at certain frequencies. My experiments have shown that the number of interdigital electrodes, and therefore the length of the conductors that they are connected to, must be increased over the number employed in the prior art SAW transducer for the device to exhibit sufficient inductive reactance. When constructed in accordance with the principles of my invention the device will have electrical characteristics which can be described by using the equivalent circuit of FIG. 2B. In particular, the device will act as the parallel combination of a capacitance $C_O$ connected across a serial combination of an inductance L and capacitance $C_r$. The impedance variation, with frequency, of this equivalent circuit is illustrated in FIG. 2C.

As is shown in FIG. 2C, the impedance of the equivalent circuit of FIG. 2B is capacitive in a range of frequencies from O to $F_r$. $F_r$ is known as the resonant frequency of the equivalent circuit for it is at this frequency that the circuit exhibits minimal impedance. As the frequency is increased beyond $F_r$ the equivalent circuit exhibits inductive reactance. The equivalent impedance of the device of FIG. 2A is inductive in a range of frequencies from $F_r$ to $F_a$. $F_a$ is known as the anti-resonant frequency of the circuit, i.e., the frequency at which the circuit exhibits infinite, i.e., large, impedance. Above the anti-resonant frequency the device again exhibits capacitive reactance.

The resonant frequency $F_r$ is determined by the periodicity of the interdigital electrodes, the interdigital electrode width and the spacing between the interdigital electrodes. The anti-resonant frequency is determined by the foregoing parameters and the electromechanical properties of the material used for the substrate. In particular, I prefer to use an interdigital electrode periodicity of one-half wave length with an interelectrode spacing equal to electrode width equal to a quarter wavelength. Those with ordinary skill in the art will understand that the wavelength for any particular frequency depends upon the piezoelectric material. As is conventional in the surface acoustic wave art the conductors 16 and 17 and the interdigital electrodes 18 can comprise a metallic film such as gold or aluminum.

As has been mentioned above the primary difference between the device of FIG. 2A and the transducer of FIG. 1, is that the device of FIG. 2A has an increased number of interdigital electrodes in order to enhance the inductive reactance so that the device exhibits the frequency characteristics shown in FIG. 2C. Although such a device gives sufficient inductive reactance to simulate a tank circuit it has a significant drawback. As the number of interdigital electrodes increases the length of the conductors 17 and 16 must also be increased. This results in an increased capacitance. As a result, the net increase in inductance is partially cancelled by the increase in capacitance.

Before describing a preferred embodiment of my invention it will be useful to set forth the theoretical background of SAW devices in accordance with my invention. When a voltage is applied to the parallel conductors, such as conductors 16 and 17, the interdigital electrodes will generate a surface elastic or acoustic wave if the voltage is in a proper frequency range. Outside this frequency range the electrodes behave merely as a capacitor. This surface wave will, in turn, induce an "e.m.f." back into the electrodes via piezoelectricity. At a specific frequency, the back emf and the applied voltage add constructively and cause a maximum amount of current to flow through the electrodes. This particular frequency is defined as the resonant frequency. At another frequency, which is usually higher than the resonant frequency, the emf will oppose the applied voltage and only a minimum amount of current can flow through the device. This frequency is referred to as the anti-resonant frequency. In between these two frequencies the device exhibits an inductive reactance and outside these two frequencies the device exhibits capacitive reactance. Those skilled in the art will recognize that this is a frequency response characteristic which is equivalent to that of a tank circuit.

As has been mentioned above, the increased number of interdigital electrodes for the device illustrated in FIG. 2A increases the inductance of the device, but it also increases the static capacitance of the device. As a result, the net increase in inductance is somewhat offset by this increase in capacitance. A preferred embodiment of my invention, illustrated in FIG. 3A, increases the inductance without increasing the capacitance.

FIG. 3A is an improvement of the surface acoustic wave device shown in FIG. 2A. In FIG. 3A, the number of interdigital electrodes 18 is kept relatively small, as in the prior art SAW devices. As a result, the inductive reactance of the conductors 16 and 17 and interdigital electrodes 18 will be inadequate to simulate a tank circuit.

In FIG. 3A, 4 is a piezoelectric substrate upon which is deposited a SAW transducer comprising parallel conductors 16 and 17 and a plurality of interdigital electrodes 18 each orthogonal to the conductors 16 and 17 with adjacent ones of the interdigital electrodes 18 connected to opposite ones of the conductors 16 and 17. The width of each of the interdigital electrodes and the spacing therebetween is chosen in accordance with the desired resonant frequency for the device. In addition, reflecting means are provided on the piezoelectric substrate. In particular, FIG. 3A illustrates that the reflecting means comprises a pair of SAW reflectors R. In particular, each of the reflectors R comprise a series of parallel reflecting elements 19. Each of the parallel reflecting elements 19 introduces discontinuities into the SAW and therefore reflect the wave back towards the transducer. Each of the reflecting elements 19 is parallel to the interdigital electrodes 18 with an equal spacing between adjacent ones of the reflecting elements 19 associated with each of the reflectors. For a thin-film device which is to exhibit a single resonant-anti-resonant frequency pair, the spacing between the reflecting elements 19 is chosen as a quarter wavelength of the resonant frequency. The width of the reflector elements 19 is also preferably a quarter wavelength. As a result the center-center spacing between reflecting elements is preferably one-half wavelength.

Figure 3B:
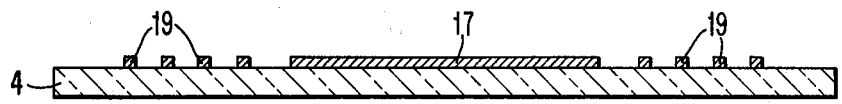
FIGS. 3B and 3C are cross sections of two respective embodiments for the plan view illustrated in FIG. 3A.

Each of the reflecting elements 19 may take various forms. In one form of the invention the reflecting elements 19 comprise a thin-metallic conductor which, as is illustrated in FIGS. 3A and 3B, are not electrically connected to either the transducer or any other reflecting element 19. The thin metallic film can either be gold or aluminum, or other suitable material. As an alternative emdobiment, each of the reflecting elements 19 may comprise a thick dielectric bar, as is illustrated in the cross section of FIG. 3B. Each of these bars has a length and width which is commensurate with the metallic thin films. The thickness of the bars is determined in accordance with their function which is to introduce a discontinuity in the surface acoustic wave propagating mechanism. The weight of the bar is a significant factor in providing this discontinuity.

Figure 3C:
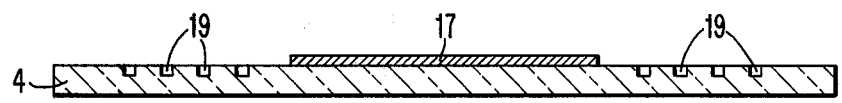

A still further alternate embodiment for each of the reflecting elements 19 is illustrated, in cross section in FIG. 3C. FIG. 3C illustrates that each of the reflecting elements 19 comprises a groove in the surface of the piezoelectric substrate 4. Each of the grooves 19 has a length and width which is commensurate with the length and the width of a metallic film conductor which comprises the first mentioned embodiment. The depth of the groove 19 is chosen so that the groove provides a sufficient discontinuity to the surface acoustic wave propagating mechanism to satisfy the desired function.

A method of manufacturing the thin-film device of FIG. 2A or FIG. 3A may begin with a suitable piezoelectric substrate 4. Using conventional photoresist techniques the thin-film conductors 16 and 17 as well as the interdigital electrodes 18 may be deposited on the substrate. Conventional techniques are employed for attaching conductors such as that illustrated in FIGS. 2A and 3A for making the electrical connection to the conductors 16 and 17.

As has been pointed out above, the resonant frequency of the thin-film device is determined by the geometrical parameters of the interdigital electrodes. For a large range of frequencies, conventional photoresist techniques provide sufficient precision for the manufacture of properly dimensioned interdigital electrodes. However, as the desired resonant frequency of the device rises, resort may be had to electron-beam exposure of the photoresist in order to increase the precision and decrease the periodicity of the interdigital electrodes. The increased precision of electron-beam exposure allows higher and higher resonant frequencies.

The foregoing steps are sufficient to provide a surface acoustic wave transducer on a suitable substrate 4 along with the necessary interconnecting conductors.

For the embodiment in which the reflecting elements 19 comprise thin-film conductors they can be deposited using the same photoresist techniques as were employed for the conductors 16 and 17 and the interdigital electrodes 18, exposing the photoresist with either light or electron beams. In the embodiment in which the reflecting elements 19 comprise dielectric bars they may be deposited using similar photoresist techniques. Furthermore, for the embodiment in which the reflecting means 19 comprise grooves such grooves may be etched in the substrate again using the conventional photoresist techniques, exposed by light or electron-beam action depending upon the desired precision and size of the grooves.

In operation the surface acoustic waves launched by the transducer comprising elements 16, 17 and 18, are reflected back to the transducer by the reflecting elements 19 on both sides thereof. Because of the spacing between the reflecting elements coherent multiple reflections occur and a standing wave is set up between the reflectors R.

Figure 3D:
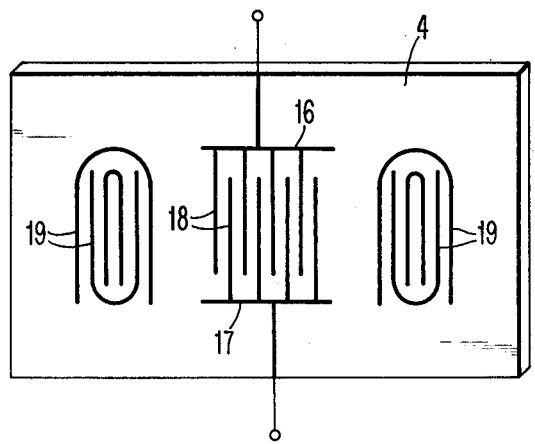
FIG. 3D is a plan view of still another preferred embodiment of our invention.

Thus far the device as disclosed, that is of FIGS. 2A and 3A have provided only a single resonant-anti-resonant frequency pair. FIG. 3D illustrates a modification of the device of FIG. 3A in order to provide a frequency response characteristic which exhibits a number of resonant-anti-resonant frequency pairs. In particular, FIG. 3D illustrates that a surface acoustic wave transducer comprising conductors 16 and 17 and interdigital electrodes 18 has been deposited on a piezoelectric substrate 4. The reflecting means of FIG. 3D is, however, different than the reflecting means of FIG. 3A. In particular, a number of the reflecting elements 19 are interconnected at different ends to form a wide band reflecting means. Such reflecting means have been disclosed in the prior art, see, for instance, "Surface Acoustic Wave Multi-Strip Components and Their Applications," by Marshall et al, appearing in IEEE Transactions on Sonic and Ultrasonics, Volume SU-20, No. 2, April 1973, beginning at page 134. See, in particular, FIG. 9, on page 137.

The frequency characteristics of the multi-strip reflector, when used as a reflecting means along with a surface acoustic wave transducer, provide a plurality of resonant-anti-resonant frequency pairs. In order to give the wide-band response with a plurality of resonant-anti-resonant frequency pairs the spacing between reflecting elements is reduced from that previously specified. Preferably the spacing is 60–80% of the previously specified distance. The particular reflecting means shown in FIG. 3D may comprise thin-film conductors, weighty dielectric bars or grooves.

Figure 4A:
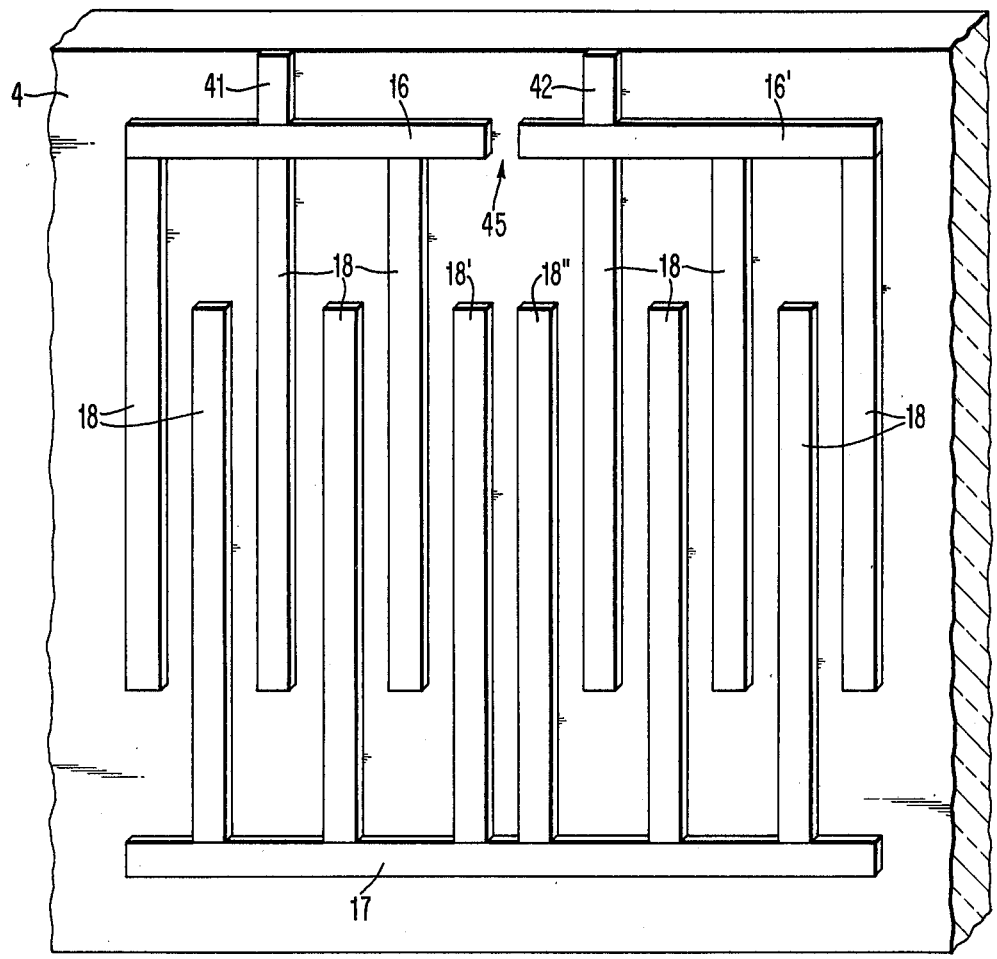
FIG. 4A is a plan view of a novel SAW transducer of my invention.

As has been mentioned with reference to FIGS. 2A and 3A the reflecting means provides additional equivalent inductance for the device such that it exhibits good tank circuit characteristics. The necessity for the reflecting means is occasioned by the unwanted increase in static capacitance when the number of interdigital electrodes is increased in an attempt to increase the equivalent inductance. The SAW transducer illustrated in FIG. 4A illustrates a novel surface acoustic wave transducer which exhibits a lower static capacitance than do prior art SAW transducers. Of course, this decrease in the static capacitance value of the SAW transducer, while maintaining the equivalent inductance, enhances the tank circuit qualities. The SAW transducer illustrated in FIG. 4A may be used to provide tank circuit characteristics with or without the reflecting means illustrated in FIG. 3A. Preferably, however, the reflecting means is also provided.

FIG. 4A illustrates the SAW transducer comprises at least three conductors 16, 16' and 17. Two of these conductors, 16 and 16' are co-linear although a gap 45 exists therebetween. As is common with other of the SAW transducers, a plurality of interdigital electrodes 18 are provided, orthogonal to the conductors 16, 17 and 16'. Outside the region adjacent the gap 45 adjacent ones of the interdigital electrodes 18 are connected to opposite ones of the conductors. However, in the region of the gap 45 a pair of interdigital electrodes 18 are connected to a common conductor. More particularly, the pair of interdigital electrodes 18, such as 18' and 18", are connected to conductor 17 which is opposite the gap 45 between the co-linear conductor 16 and 16'. Interconnecting leads 41 and 42 illustrate that the thin-film device is connected to an external circuit by the conductors 16 and 16'. Thus, the conductor 17 is not connected in an external circuit. Those with ordinary skill in the art will understand, from the previous description of the manner of manufacture of these thin-film devices, the manner in which the transducer of FIG. 4A may be manufactured.

The width of the interdigital electrodes 18 and the spacing therebetween is determined from the same parameters which are useful in determining the parameters for the other SAW transducers disclosed above.

In operation the transducer generates a surface acoustic wave much in the manner that the previously described transducers do. However, by reason of the external connections, the static capacitance of the device is decreased below the equivalent static capacitance had there been no gap 45. The static capacitance of these devices is related to the length of the parallel spaced conductors and more particularly the number of interdigital electrodes. Since the gap 45 may be small in comparison with the length of the conductors 16 and 16' the reduction in static capacitance occurs by reason of the electrical interconnection and not by the length of the gap 45.

Figure 4B:
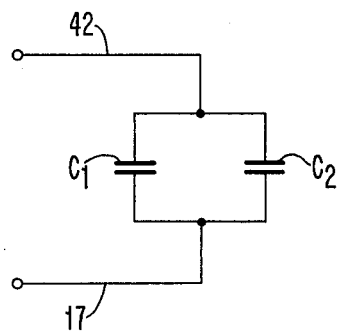
FIGS. 4B and 4C are equivalent circuit diagrams useful in explaining the advantage of the novel SAW transducer.
Figure 4C:
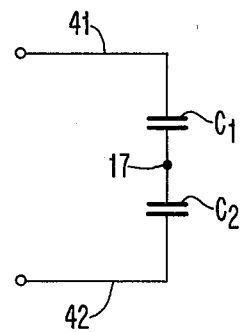

To illustrate the point, FIG. 4B illustrates the effective equivalent capacitance for the device of FIG. 4A in which the conductors 16 and 16' have no gap 45 and are, in reality, a single conductor. We can, however, for a static capacitance computation, consider them different conductors. Thus one portion of the pair 16 and 17 would have an equivalent capacitance $C_1$ and a second portion would have an equivalent capacitance $C_2$, where $C_1$ equals $C_2$ assuming that each portion included an equal length. The static capacitance is a function of the number and extent of interdigital electrodes. In the case of no gap 45 they then form parallel connected capacitors as shown in FIG. 4B. Thus, as illustrated in FIG. 4B, the equivalent capacitance $C_e = C_1 + C_2$. However, assuming that the conductors 16 and 16' were equal, that is the gap 45 occurred in the middle, and with the interconnecting arrangement as illustrated in FIG. 4A, the equivalent static capacitance can be computed using the equivalent circuit of FIG. 4C. In this case, as should be readily apparent, the equivalent circuit comprises a pair of serially connected capacitors. Where the capacitor $C_1 = C_2$, the equivalent capacitance $C_e = \frac{1}{2}C_1$. In the circuit of FIG. 4C, terminal 41 is connected to conductor 16 and terminal 42 is connected to conductor 16'. The common terminal of capacitors $C_1$ and $C_2$ represents conductor 17.

Those with ordinary skill in the art will understand how the principles of the device illustrated in FIG. 4A can be expanded to include SAW transducers with more than three conductors. For instance, a SAW transducer may comprise four conductors, with two pairs of co-linear conductors. There would then be two gaps 45, each between a different pair of co-linear conductors. The latter arrangement will be effectively equivalent to three equal capacitances in series, and thus the total will be ⅓ of each capacitance, yet the SAW generated by the three units is enhanced.

Figure 5A:
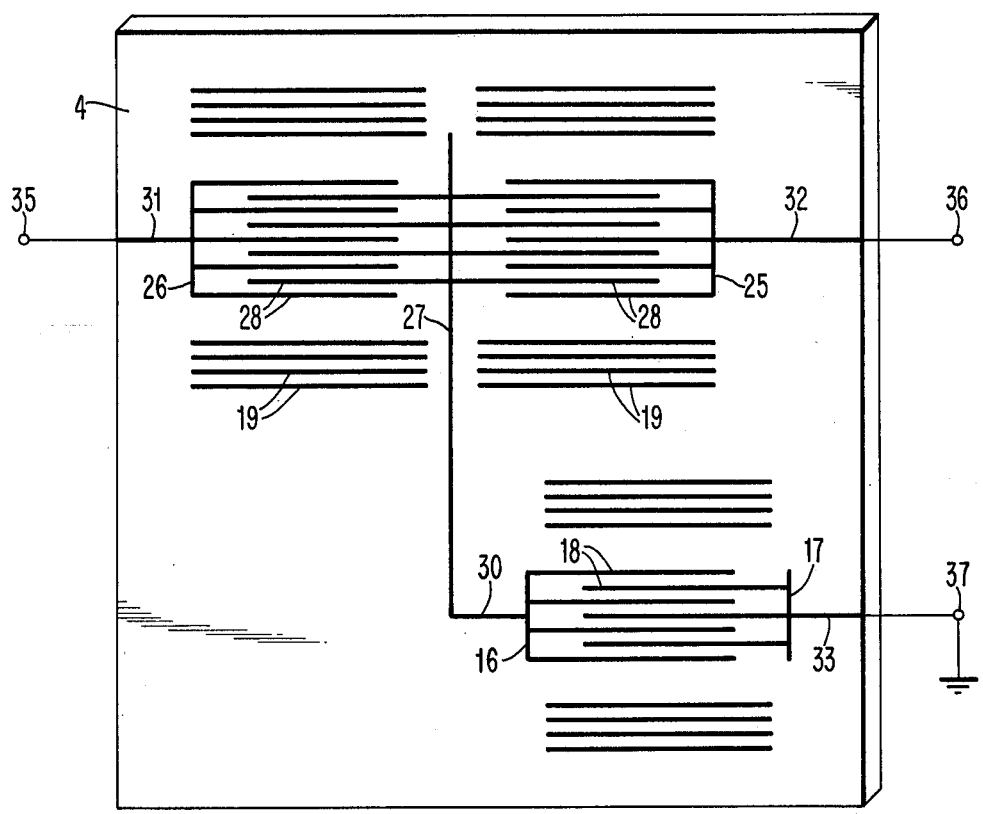
FIG. 5A is a plan view of a surface acoustic wave filter which has the characteristics of a T circuit.

FIG. 5A illustrates the manner in which a T network can be constructed in accordance with the principles of this invention. FIG. 5A illustrates a piezoelectric substrate 4 on which has been deposited a pattern of conductors 16, 17, 25, 26 and 27 which form components of three SAW transducers and interconnecting conductors 30, 31, 32 and 33. An input terminal 35 is connected over conductor 31 to conductor 26. Conductor 27 is connected via conductor 30 to conductor 16. Conductor 25 is connected to terminal 36 by conductor 32 and conductor 17 is connected to ground by conductor 33 through terminal 37. Terminals 35, 36, and 37 form the three external terminals of a T-filter. A first SAW transducer simulating a single tank circuit comprises conductors 26 and 27 and the interdigital electrodes 28 therebetween. A second SAW transducer simulating a second tank circuit comprises conductors 27 and 25 and interdigital electrodes 28 therebetween. Finally, a third SAW transducer simulating a third tank circuit includes conductors 16, 17 and the interdigital electrodes 18. FIG. 5A illustrates that reflecting means are associated with each of these devices in accordance with a preferred embodiment of my invention. Although FIG. 5A illustrates a particular orientation for each of these tank circuit simulating elements, it should be apparent to those skilled in the art that the orientation of any of the SAW transducers can be varied at will as well as the relative orientation of these devices. Although the conductor 27 is common to two SAW transducers, it should be understood that that is not essential to practicing my invention. Two conductors, electrically interconnected, will serve as well, although the pattern illustrated in FIG. 5A offers the advantage of simplicity.

Figure 5B:
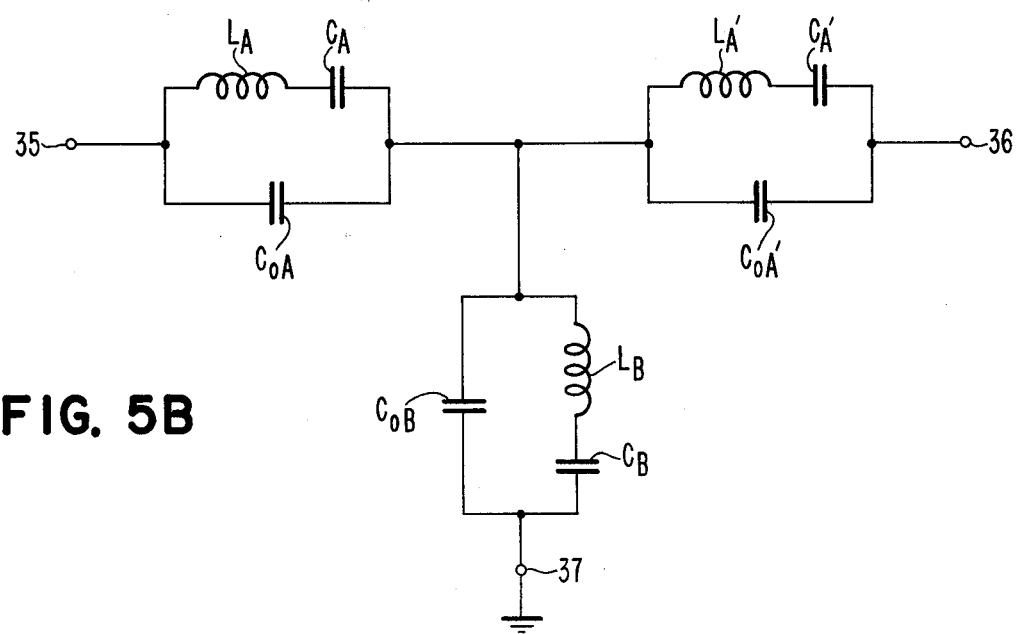
FIG. 5B is an equivalent electrical circuit diagram of the device shown in FIG. 5A.
Figure 5C:
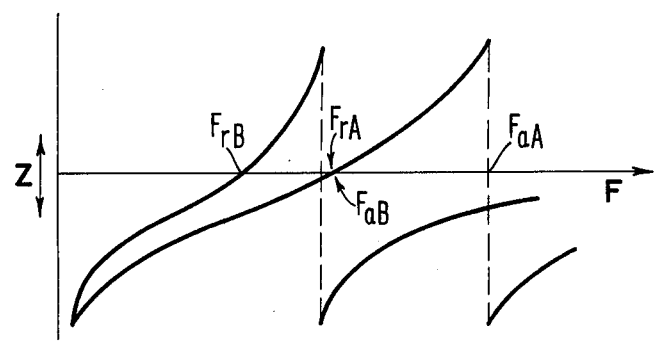
FIG. 5C is a plot of impedance versus frequency for the components of the equivalent circuit shown in FIG. 5B.

An equivalent circuit for the device illustrated in FIG. 5A is shown in FIG. 5B. In accordance with FIG. 2B, FIG. 5B illustrates the equivalent circuit for each of the SAW transducers as comprising an inductor serially connected to a capacitor with a second capacitor connected in parallel with the foregoing pair. The first SAW transducer is represented, in the equivalent circuit of FIG. 5B, by $L_A$, $C_A$ and $C_{oA}$; the second SAW transducer is represented in the equivalent circuit of FIG. 5B by $L_A$, $C_A$ and $C_{oA}$; and the third SAW transducer is represented in the equivalent circuit of FIG. 5B, as comprising $L_B$, $C_B$ and $C_{oB}$. Although the parameters which determine the resonant and anti-resonant frequencies for each of the SAW transducers can be selected within a wide range, the characteristics shown in FIG. 5C provide a typical illustration. FIG. 5C illustrates that the resonant frequency for the third SAW transducer is $F_{rB}$ which is less than the anti-resonant frequency for that element $F_{aB}$; however, $F_{aB}$ is equal to the resonant frequency of the first SAW transducer, $F_{rA}$ which is also equal to the resonant frequency of the second SAW transducer. And, of course, the anti-resonant frequency $F_{oA}$ for the latter two SAW transducers is greater than the resonant frequency $F_{rA}$. This is graphically illustrated in FIG. 5C which shows the impedance versus frequency characteristic for each of the devices separately.

Figure 5D:
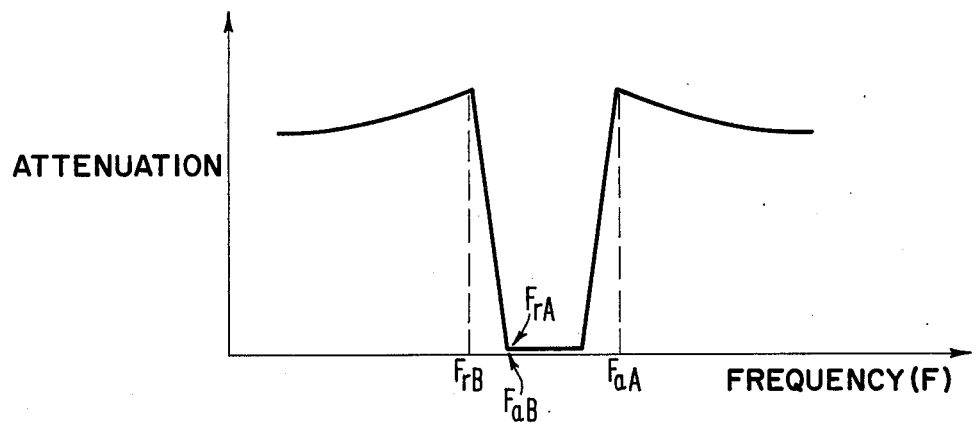
FIG. 5D is a plot of attenuation versus frequency for the device illustrated in FIG. 5A.

FIG. 5D illustrates the attenuation characteristics for the network of FIG. 5A, as a function of frequency. As the input frequency varies from low frequencies to $F_{rB}$ all three devices are capacitive. At $F_{rB}$ the third SAW transducer is at resonance and thus the impedance of the device is practically zero. The network of FIG. 5A therefore exhibits a high attenuation. As the frequency increases to the resonant frequency of the first and second SAW transducers each will exhibit a small impedance. At the same time, however, the third SAW transducer exhibits a high impedance and thus the network of 5A has a very low attenuation at and above this frequency. This pass band extends up until the frequency reaches the anti-resonant frequency $F_{aA}$ at which the first and second SAW transducers approach an open circuit. Thus, the overall network is a narrow band pass filter. It will be appreciated that this narrow pass band filter characteristic is derived from a device which is entirely thin-film, which is constructed by evaporating conductive patterns, or their equivalents, on a piezoelectric substrate. Those skilled in the art will appreciate that it may not be necessary to use the embodiment of my invention which includes the reflecting means, but that it may be possible to employ the device illustrated in FIG. 2A or FIG. 4. Furthermore, in those embodiments which employ the reflecting means they may take any of the forms illustrated in FIGS. 3A, 3B or 3C as described in the accompanying portions of the specification.

Figure 6:
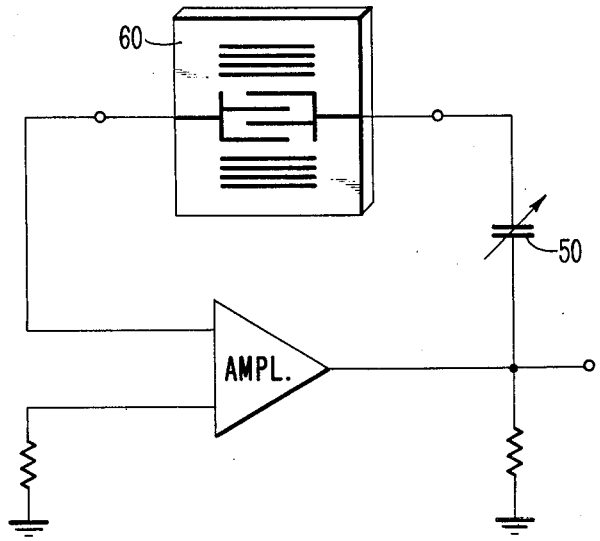
FIG. 6 is a schematic representation of an oscillator using the surface acoustic wave device of my invention.

FIG. 6 is another typical example of the use of the SAW transducer of my invention for simulating a tank circuit of an oscillator application. In particular, a device 60 constructed in accordance with the teachings of my invention may be connected between an amplifier input terminal and a variable capacitor 50. By connecting the other terminal of the variable capacitor to the amplifier output terminal the resulting circuit may be made to oscillate at a frequency or frequencies dependent upon the properties of the SAW transducer 60 and the variable capacitor 50. In one embodiment, employing a SAW transducer according to the principles of my invention which has a single resonant-anti-resonant frequency pair, the capacitor 50 may be omitted, and the frequency of oscillation will be determined by the parameters of the SAW transducer 60.

However, by employing an SAW transducer 60 having a plurality of resonant-anti-resonant frequency pairs the circuit is capable of oscillating at a number of different frequencies in a band or range. The particular frequency of oscillation may be determined by selecting the value of the capacitor 50. Typically, the variable capacitor 50 may actually comprise a PIN diode whose capacitance can be varied by changing the bias current. Such an oscillator, which is capable of oscillating at a number of different frequencies, may be useful in tuner applications in which a receiver or transmitter must be capable of tuning to a number of different frequencies. Thus, by merely changing the bias on the PIN diode the frequency of oscillation can be accurately and precisely controlled.

What is claimed is:

1. An improved surface acoustic wave transducer exhibiting a lower equivalent capacitance compared with prior surface acoustic wave transducers comprising:
   a piezoelectric substrate,
   a first plurality of at least three parallel conductors deposited on said substrate, two of said parallel conductors having means for connecting said transducer to an electrical circuit, a first and second of said parallel conductors being co-linear and having a gap therebetween, a second plurality of parallel conductors orthogonal to first said plurality, each of said second plurality connected to one of said first plurality, alternate ones of said second plurality connected to one of said co-linear conductors or said other conductor except in the vicinity of said gap where two adjacent conductors of said second plurality are connected to said other conductor.

2. The transducer of claim 1 wherein each of said second plurality of conductors is of equal length and width and spaced from adjacent ones of said second plurality of parallel conductors by equal distances.

3. A two-terminal thin-film device exhibiting tank circuit characteristics comprising:

a piezoelectric substrate a single surface acoustic wave transducing means including at least a pair of conductors with interdigital electrodes deposited on said substrate, surface acoustic wave reflecting means on said substrate adjacent said pair of conductors comprising a pair of surface acoustic wave reflectors located on opposite sides of said surface acoustic wave transducing means, said surface acoustic wave transducing means exhibiting at least one resonant and anti-resonant frequency pair, each of said conductors connected to a different one of said two terminals, each of said reflectors comprising a series of parallel reflector elements, each of which is spaced from adjacent reflector elements by a quarter wavelength of said resonant frequency.

4. A two-terminal thin-film device exhibiting tank circuit characteristics comprising:

a piezoelectric substrate, a single surface acoustic wave transducing means including at least a pair of conductors with interdigital electrodes deposited on said substrate, surface acoustic wave reflecting means on said substrate adjacent said pair of conductors comprising a pair of surface acoustic wave reflectors located on opposite sides of said surface acoustic wave transducing means, said surface acoustic wave transducing means exhibiting a plurality of resonant-anti-resonant frequency pairs wherein each of said reflectors comprise a plurality of parallel reflector elements spaced by a distance less than a quarter wavelength of a resonant frequency intermediate extreme ones of said resonant frequencies.

5. A thin-film filter comprising a plurality of interconnected thin-film means deposited on a piezoelectric substrate, each of said thin-film means comprising:

a single surface acoustic wave transducing means including at least a pair of conductors with interdigital electrodes deposited on said substrate and surface acoustic wave reflecting means, said transducing means exhibiting at least one resonant and anti-resonant frequency pair, said reflecting means comprising a pair of reflectors, located on opposite sides of said transducing means.

6. The filter of claim 5 in which each of said reflectors comprise a plurality of reflecting elements.

7. The filter of claim 6 in which each of said reflecting elements comprise conductive material deposited on said substrate.

8. The filter of claim 6 in which each of said reflecting elements comprise dielectric material of sufficient weight to reflect surface acoustic waves deposited on said substrate.

9. The filter of claim 6 in which each of said reflecting elements comprise grooves in said substrate to reflect surface acoustic waves.

* * * * *

UNITED STATES PATENT AND TRADEMARK OFFICE
CERTIFICATE OF CORRECTION

PATENT NO. : 4,166,258
DATED : August 28, 1979
INVENTOR(S) : TSENG

It is certified that error appears in the above-identified patent and that said Letters Patent are hereby corrected as shown below:

In column 6, line 21, correct the spelling of "embodiment".

Signed and Sealed this

Fifth Day of February 1980

[SEAL]

Attest:

SIDNEY A. DIAMOND

Attesting Officer

Commissioner of Patents and Trademarks